(12) United States Patent
Huang

(10) Patent No.: US 9,979,147 B1
(45) Date of Patent: May 22, 2018

(54) MULTI-FUNCTIONAL USB HUB

(71) Applicant: Cheng Yu Huang, New Taipei (TW)

(72) Inventor: Cheng Yu Huang, New Taipei (TW)

( * ) Notice: Subject to any disclaimer, the term of this patent is extended or adjusted under 35 U.S.C. 154(b) by 0 days. days.

(21) Appl. No.: 15/611,918

(22) Filed: Jun. 2, 2017

(30) Foreign Application Priority Data

May 19, 2017 (TW) .............................. 106207151 U

(51) Int. Cl.
| | |
|---|---|
| *H01R 25/00* | (2006.01) |
| *H05K 5/00* | (2006.01) |
| *H01R 13/717* | (2006.01) |
| *H01R 13/66* | (2006.01) |

(52) U.S. Cl.
CPC ......... *H01R 25/006* (2013.01); *H01R 13/665* (2013.01); *H01R 13/7175* (2013.01); *H05K 5/0047* (2013.01)

(58) Field of Classification Search
CPC ...... H02J 7/0052; H02J 7/0027; H02J 7/0042; H02J 7/0021; H02J 2007/0062; H02J 7/355; H02J 7/0044; H02J 7/0047; H05K 5/00; H05K 5/004; H05K 5/0021; H05K 5/0047; H05K 5/0052; H05K 5/0026; H05K 5/0073; H05K 5/0204; H05K 5/0226; H05K 7/14; H05K 5/0234; H05K 5/0239; H05K 5/0273; H05K 5/0286
See application file for complete search history.

(56) References Cited

U.S. PATENT DOCUMENTS

| | | | | |
|---|---|---|---|---|
| 8,183,825 | B2 * | 5/2012 | Sa .......................... | H02J 7/0044 320/107 |
| 9,423,844 | B2 * | 8/2016 | Strauser .................. | G06F 1/266 |
| 9,425,651 | B2 * | 8/2016 | Strauser ................ | G06F 1/1632 |
| 9,601,934 | B2 * | 3/2017 | Ikegami ................ | H02J 7/0044 |
| 9,685,803 | B2 * | 6/2017 | Strauser ................ | H02J 7/0044 |
| 2009/0278495 | A1 * | 11/2009 | Kaye ...................... | H02J 7/0027 320/114 |
| 2016/0218535 | A1 * | 7/2016 | Prete ...................... | H02J 7/0044 |
| 2016/0352118 | A1 * | 12/2016 | Huang ................... | H02J 7/0044 |

* cited by examiner

*Primary Examiner* — James Harvey
*Assistant Examiner* — Matthew T Dzierzynski
(74) *Attorney, Agent, or Firm* — Jackson IPG PLLC; Demian K. Jackson

(57) ABSTRACT

A multi-functional USB hub includes a casing including U-shaped first openings, grooved rails alternating with the first openings, grooves each being inward of a corresponding grooved rail, each groove having a T-shaped cross-section and communicating with the corresponding grooved rail, and second, third, and fourth openings on a front end; a cover including inverted U-shaped openings, grooved rails alternating with the inverted U-shaped openings, and transverse top troughs, each interconnecting two opposite grooved rails and communicating therewith so that the casing and the cover are fastened together; a PCB in the casing and the cover and including USB ports on either side, each USB port being in both the first opening and its corresponding inverted U-shaped opening, LEDs on either side and alternating with the USB ports; and inverted U shaped sliding members, each including two vertical parts on two sides respectively, a horizontal part, and two inner slides.

2 Claims, 6 Drawing Sheets

MULTI-FUNCTIONAL USB HUB

BACKGROUND OF THE INVENTION

1. Field of the Invention

The invention relates to USB (Universal Serial Bus) hubs and more particularly to a multi-functional USB hub having improved characteristics.

2. Description of Related Art

Conventional mobile phones (e.g., smartphones) and tablet computers (called tablets) have features including lightweight, portability, telephony, photo taking, illumination, alarm clock, calendar and Internet access. Most of their functions are the same as desktop computers with some even more advanced. Thus, they become more popular among consumers.

While mobile phones and tablets have features including lightweight and portability, charging, connection, disconnection and holder preparation are required. Preparation and storage of battery charger and holder is not easy and tedious. For example, mobile phones, tablets, laptops, digital cameras, and external hard disk drives may be used at the same time. Connections of USB plugs and USB ports and locations of holders can be messy and cause great inconvenience.

There are a wide variety of USB hubs for charging and electrical connection as well as holders for mobile phone and tablet commercially available. However, they are single function products. Thus, a user has to spend a lot of money to buy them if such need arises. Further, their use and storage are not convenient. Furthermore, the conventional USB hubs and holders for mobile phone and tablet are bulky. This is because, for example, a tablet placed thereon is subject to fall if they are made compact.

Thus, the need for improvement still exists.

SUMMARY OF THE INVENTION

It is therefore one object of the invention to provide a multi-functional USB hub comprising a casing including a plurality of U-shaped first openings on either side, a plurality of grooved rails on either side and alternating with the first openings, a plurality of grooves on either side, each groove being disposed inward of a corresponding one of the grooved rails, each groove having a T-shaped cross-section and communicating with the corresponding grooved rail, a second opening on a front end, a third opening on the front end, and a fourth opening on the front end; a cover including a plurality of inverted U-shaped openings on either side, a plurality of grooved rails on either side and alternating with the inverted U-shaped openings, and a plurality of transverse top troughs, each top trough interconnecting two opposite ones of the grooved rails and communicating therewith so that the casing and the cover are configured to complimentarily fasten together; a printed circuit board (PCB) disposed in both the casing and the cover and including a plurality of USB ports on either side, each USB port being disposed in both the first opening and its corresponding inverted U-shaped opening, a plurality of light emitting diodes (LED) on either side and alternating with the USB ports, a power-on light on a front end and disposed in the second opening, a power socket on the front end, the power socket being aligned with and joining the third opening, and a USB receptacle on the front end and disposed in the fourth opening; and a plurality of inverted U shaped sliding members, each including two vertical parts on two sides respectively, a horizontal part interconnecting the vertical parts, and two slides, each having a T-shaped cross-section and formed on an inner surface of the vertical part, and each slide being configured to slide a predetermined maximum distance in the corresponding groove of the same side; wherein in an inoperative state, one vertical part of each sliding member is disposed in the grooved rail of the casing and its corresponding grooved rail of the cover of the same side, the horizontal part of each sliding member is disposed in the transverse trough, the other vertical part of each sliding member is disposed in the grooved rail of the casing and its corresponding grooved rail of the cover of the same side, and each slide is on a bottom of the corresponding groove of the casing of the same side; and wherein the sliding members are configured to pull upward by sliding the slides along the grooves of the casing and sliding the vertical parts along the grooved rail of the casing and its corresponding grooved rail of the cover of the same side until being stopped.

The above and other objects, features and advantages of the invention will become apparent from the following detailed description taken with the accompanying drawings.

DETAILED DESCRIPTION OF THE INVENTION

Figure 1:
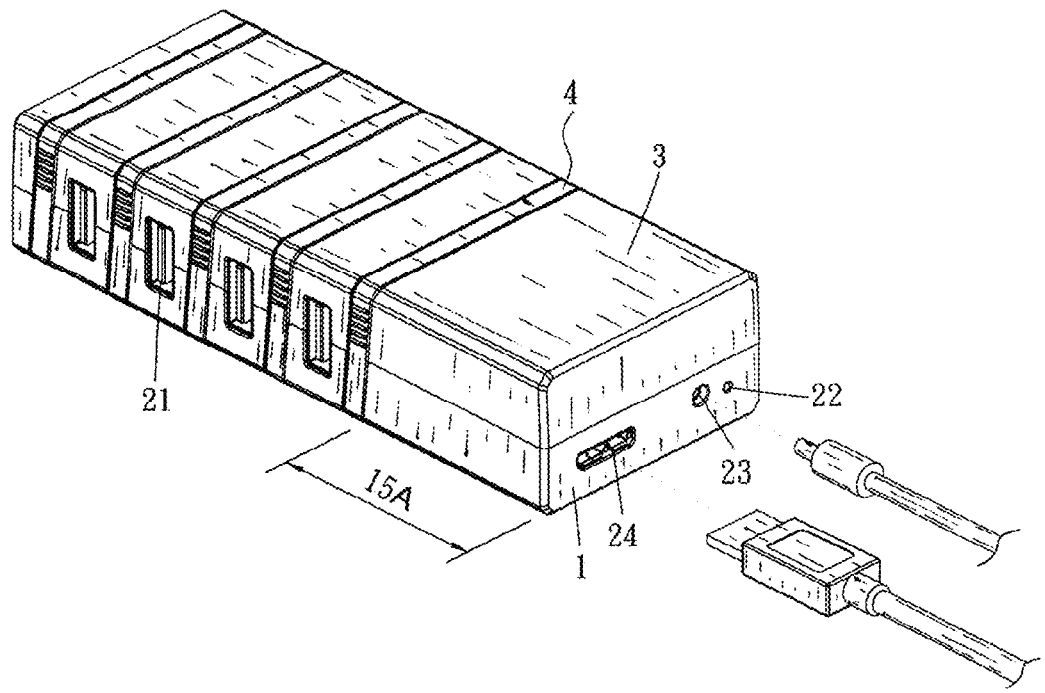
FIG. 1 is a perspective view of a multi-functional USB hub according to a first preferred embodiment of the invention.

Referring to FIGS. 1 to 4, a multi-functional USB hub in accordance with a first preferred embodiment of the invention comprises the following components as discussed in detail below.

A parallelepiped casing 1 includes a plurality of U-shaped first openings 11 on either side, a plurality of grooved rails 15 on either side and alternating with the first openings 11, a plurality of grooves 16 on either side, each groove 16 disposed inward of a corresponding grooved rail 51, each groove 16 having a T-shaped cross-section and communicating with the corresponding grooved rail 15, a second opening 12 on a front end, a third opening 13 on the front end, and a fourth opening 14 on the front end.

A parallelepiped cover 3 includes a plurality of inverted U-shaped openings 31 on either side, a plurality of grooved rails 32 on either side and alternating with the inverted U-shaped openings 31, and a plurality of transverse troughs 33 on a top, each transverse trough 33 interconnecting two opposite grooved rails 32 and communicating therewith.

The casing 1 and the cover 3 are complimentarily fastened together. Each grooved rail 15 and its corresponding grooved rail 32 of the same side are joined together to form a complete grooved rail. Each U-shaped first opening 11 and its corresponding inverted U-shaped opening 31 are joined together to form a complete opening.

A printed circuit board (PCB) 2 is disposed in both the casing 1 and the cover 3 and includes a plurality of USB ports 21 on either side, each USB port 21 disposed in both the U-shaped first opening 11 and its corresponding inverted U-shaped opening 31, a plurality of light emitting diodes (LED) 25 on either side and alternating with the USB ports 21, a power-on light 22 on a front end and disposed in the second opening 12, a power socket 23 on the front end, the power socket 23 aligned with and joining the third opening 13, and a USB receptacle 24 on the front end and disposed in the fourth opening 14.

A plurality of inverted U shaped sliding members 4 each include two vertical parts 41 on two sides respectively, a horizontal part 42 interconnecting the vertical parts 41, and two slides 43 each having a T-shaped cross-section. Each slide 43 is formed on an inner surface of the vertical part 41 and adjacent to a bottom of the vertical part 41. Each slide 43 is configured to slide a predetermined maximum distance in the corresponding groove 16 of the same side.

In an inoperative state, one vertical part 41 of each sliding member 4 is disposed in the grooved rail 15 and its corresponding grooved rail 32 of the same side, the horizontal part 42 of each sliding member 4 is disposed in the transverse trough 33, the other vertical part 41 of each sliding member 4 is disposed in the grooved rail 15 and its corresponding grooved rail 32 of the same side, and the slide 43 is on a bottom of the corresponding groove 16 of the same side. The top of the cover 3 is thus substantially even.

Figure 2:
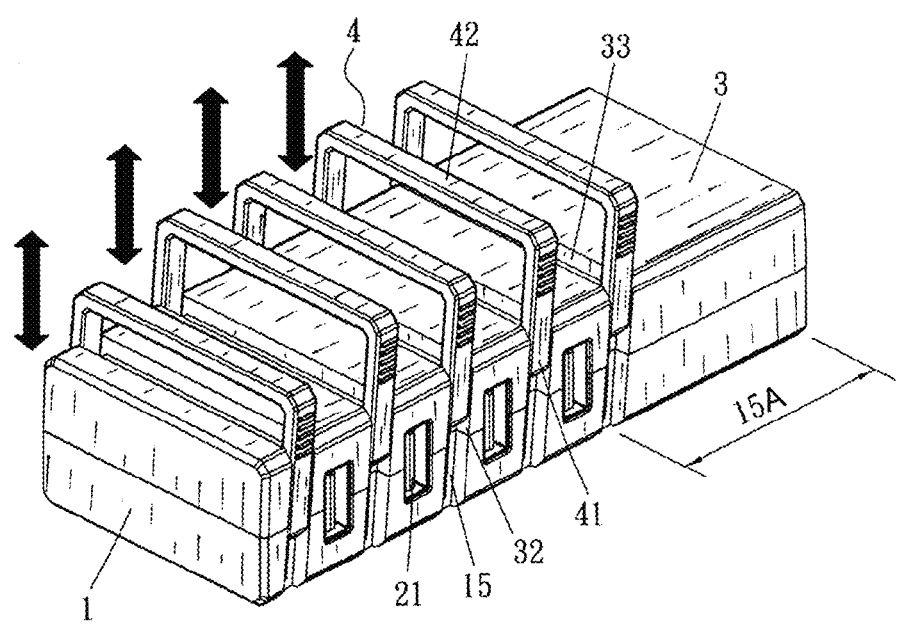
FIG. 2 is a view similar to FIG. 1 showing the sliding members being pulled up.
Figure 3:
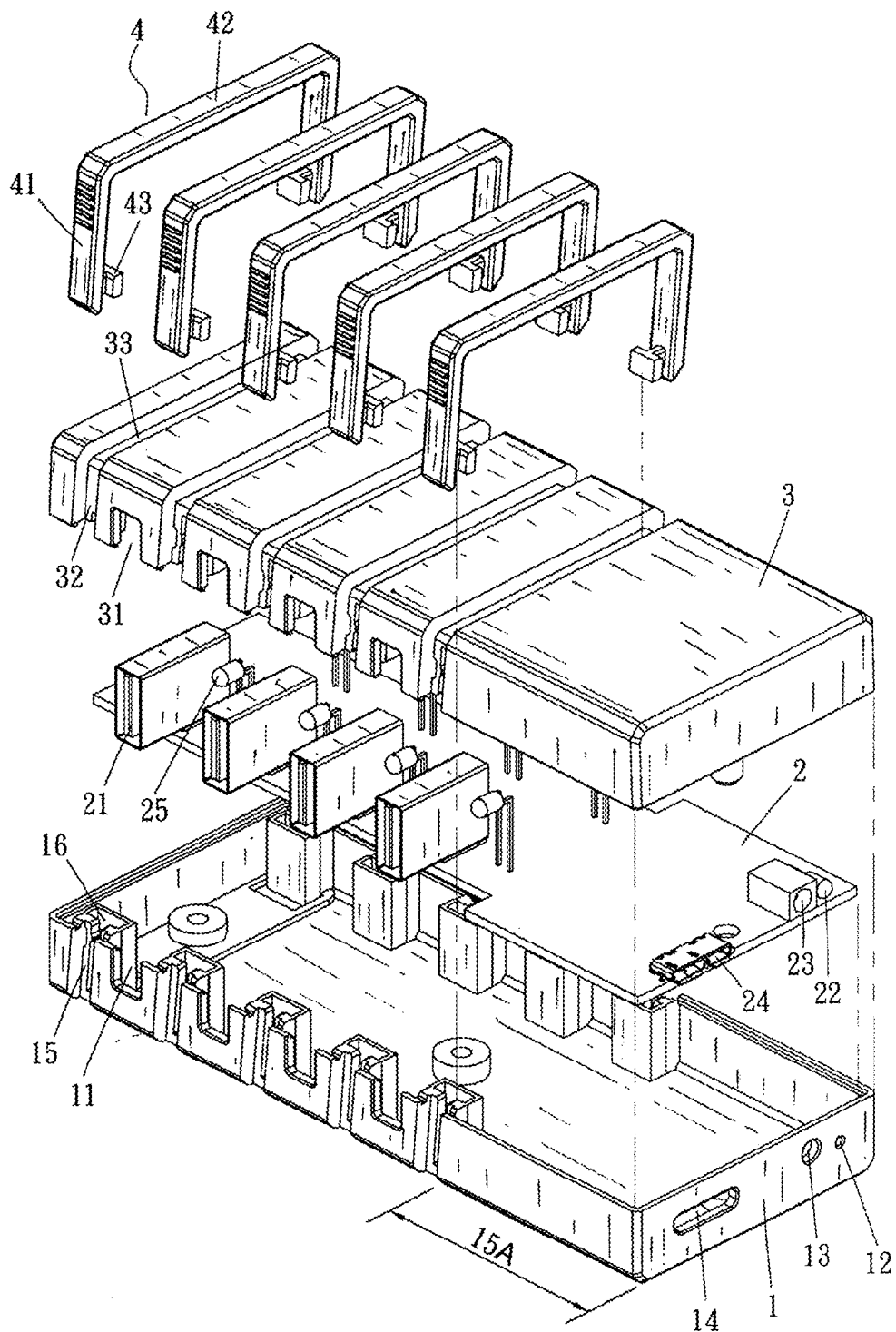
FIG. 3 is an exploded view of FIG. 1.
Figure 4:
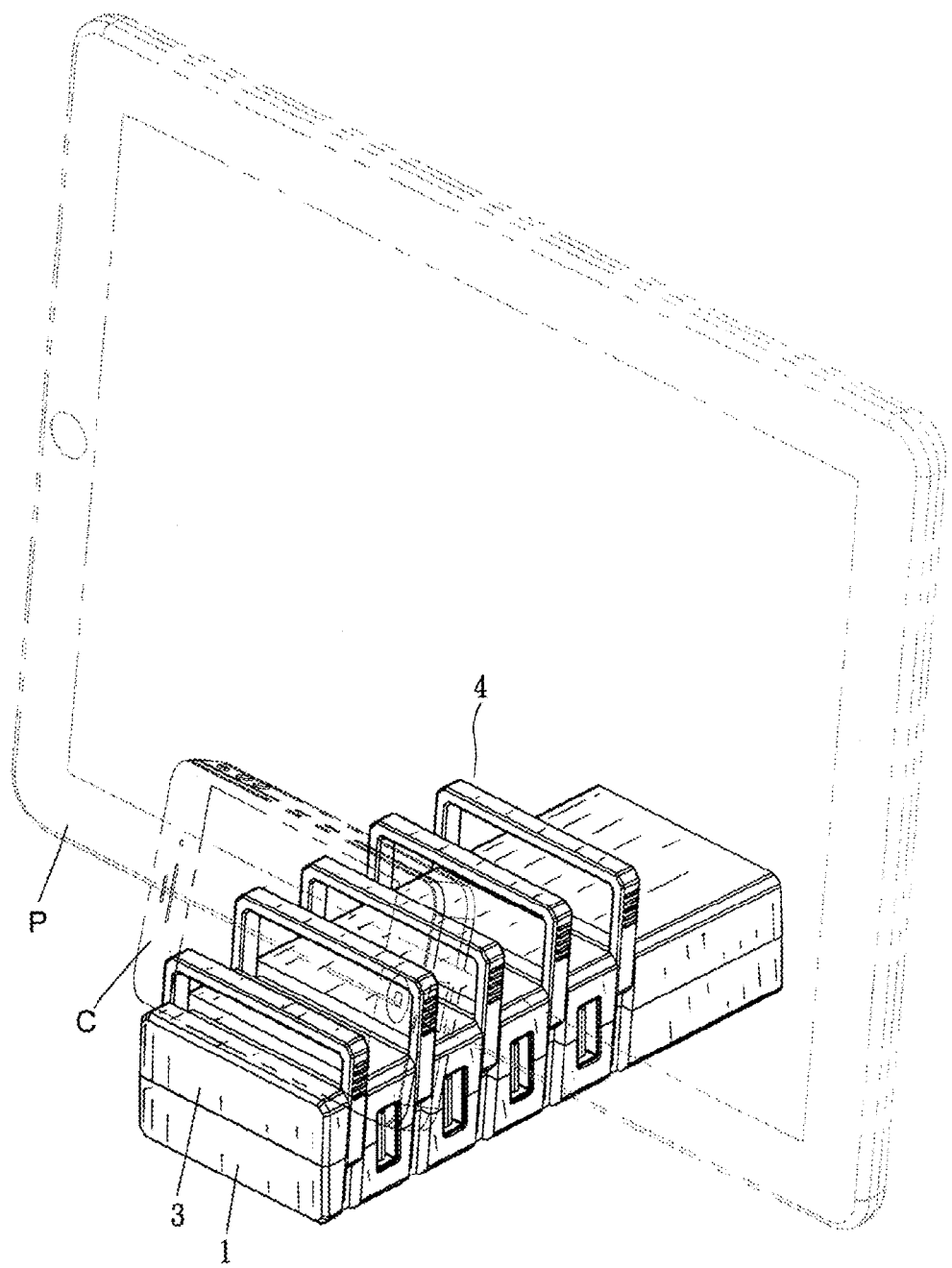
FIG. 4 is a view similar to FIG. 2 showing a mobile phone being placed in a section of the cover between two adjacent sliding members, and a tablet being placed in another section of the cover between two adjacent sliding members.
Figure 5:
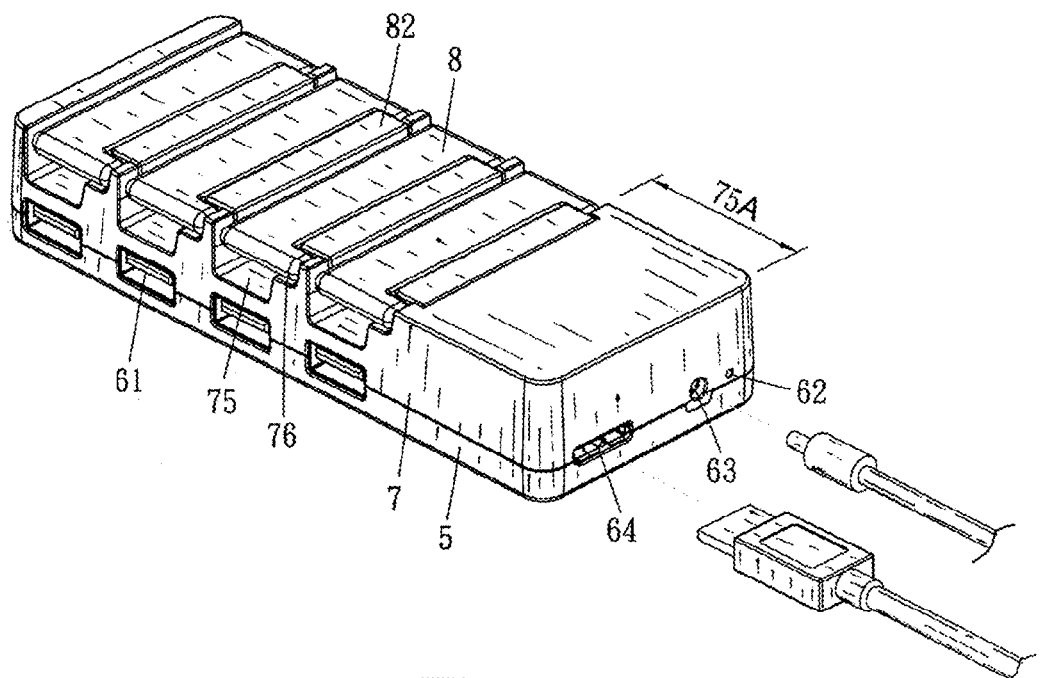
FIG. 5 is a perspective view of a multi-functional USB hub according to a second preferred embodiment of the invention.

As shown in FIGS. 2 and 4, in a use state a user may pull the sliding members 4 upward by sliding the slides 43 along the grooves 16 and sliding the vertical parts 41 along the grooved rail 15 and its corresponding grooved rail 32 of the same side until being stopped. At this position, each of some slides 43 are on a top of the corresponding groove 16 of the same side, and the horizontal parts 42 are above the corresponding transverse troughs 33. Thereafter, the user may place a tablet P in a section of the top of the cover 3 between two adjacent sliding members 4, and place a mobile phone C in another section of the top of the cover 3 between two adjacent sliding members 4. It is noted that the weight of, a section of each of the casing 1 and the cover 3 indicated by 15A, is configured to provide additional support to the inclined mobile phone C and the inclined tablet P so that both the mobile phone C and the tablet P can be stably supported. In this position, a charging of the mobile phone C and/or the tablet P can be performed. A connection of the mobile phone C and/or the tablet P to the multi-functional USB hub is also possible. The LEDs 25 are activated to illuminate the sliding members 4. The power-on light 22 is also lit.

Referring to FIGS. 5 to 8, a multi-functional USB hub in accordance with a second preferred embodiment of the invention is shown. The characteristics of the second preferred embodiment are described below.

A parallelepiped casing 5 includes a plurality of U-shaped openings 51 on one side, and a U-shaped indentation 52 on a front end.

A parallelepiped cover 7 includes a plurality of inverted U-shaped first openings 71 on one side, a second opening 72 on a front end, a third opening 73 on the front end, a fourth opening 74 on the front end, a plurality of transverse troughs 75 on a top, a plurality of transverse risers 76 each adjacent to the trough 75, and a plurality of elongated cavities 77 each spaced from the riser 76.

The casing 5 and the cover 7 are complimentarily fastened together. Each U-shaped opening 51 and its corresponding inverted U-shaped first opening 71 of the same side are joined together to form a complete opening. The indentation 52 and its corresponding fourth opening 74 of the front end are joined together to form a complete opening.

A printed circuit board (PCB) 6 is disposed in both the casing 5 and the cover 7 and includes a plurality of USB ports 61 on one side, each USB port 61 disposed in both the U-shaped opening 51 and its corresponding inverted U-shaped opening 71, a plurality of light emitting diodes (LED) 65 on one side and alternating with the USB ports 61, a power-on light 62 on a front end and disposed in the second opening 72, a power socket 73 on the front end, the power socket 73 aligned with and joining the third opening 73, and a USB receptacle 64 on the front end and disposed in both the indentation 52 and its corresponding fourth opening 74 of the front end.

A plurality of inverted U shaped pivotal members 8 each include two opposite pivots 81 on an inner surface, and a separate, elongated covering element 82 having two wells 83 at two sides respectively. The wells 83 are pivotably secured to the pivots 81. The covering element 82 is placed on the cavity 77.

In an inoperative state, the pivotal members 8 are pivotably disposed on the top of the cover 7.

Figure 6:
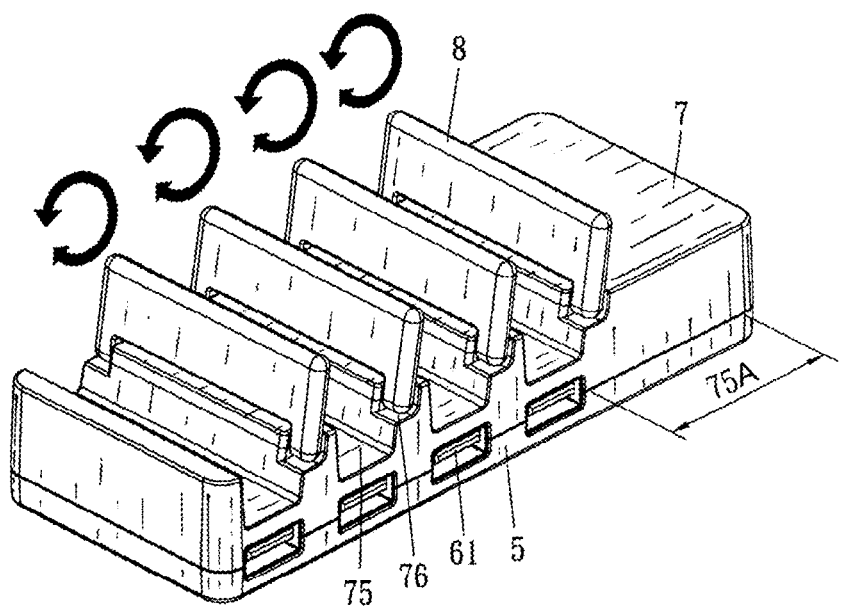
FIG. 6 is a view similar to FIG. 5 showing the pivotal members being rotated to a ready to use position.
Figure 7:
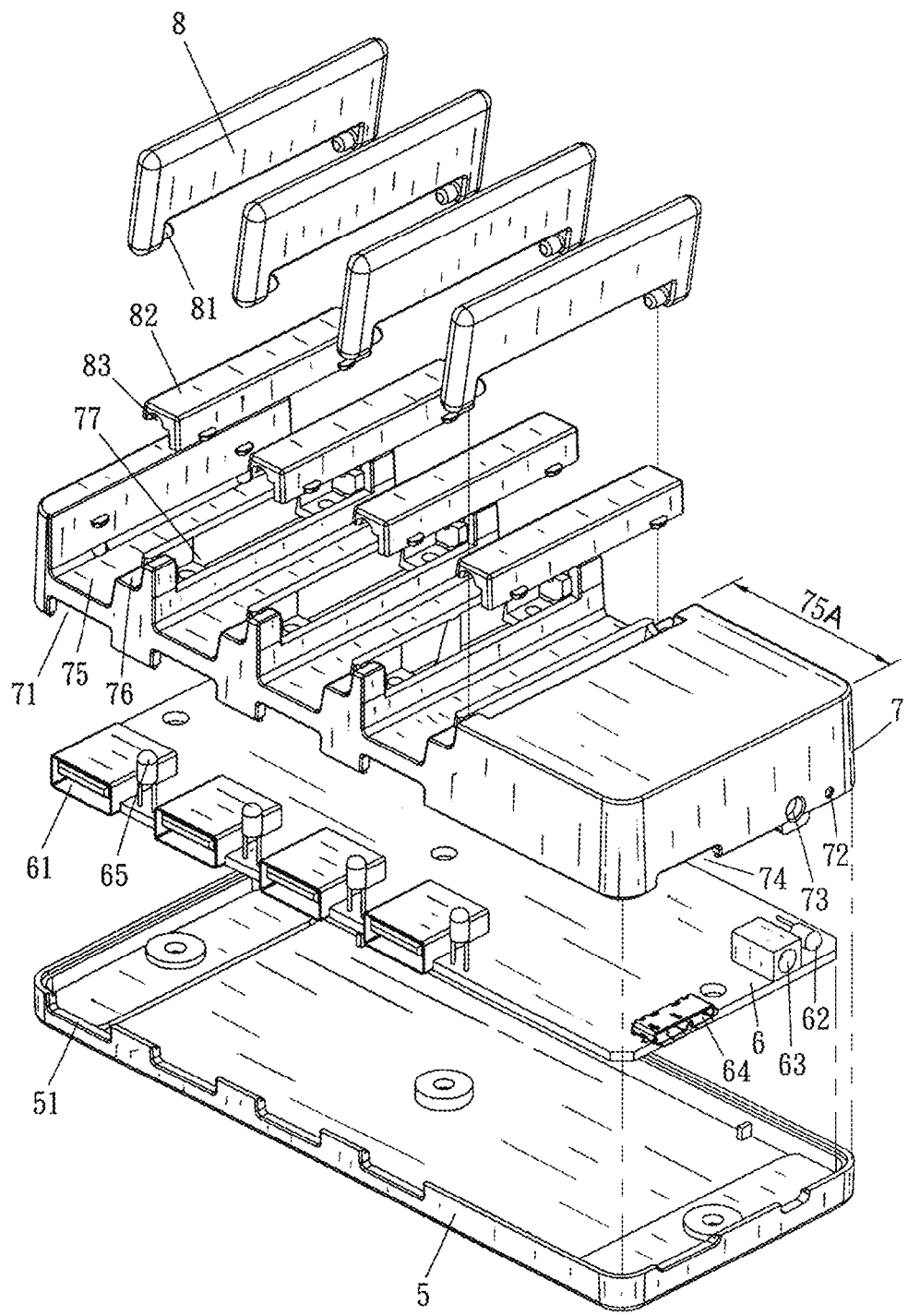
FIG. 7 is an exploded view of FIG. 5.
Figure 8:
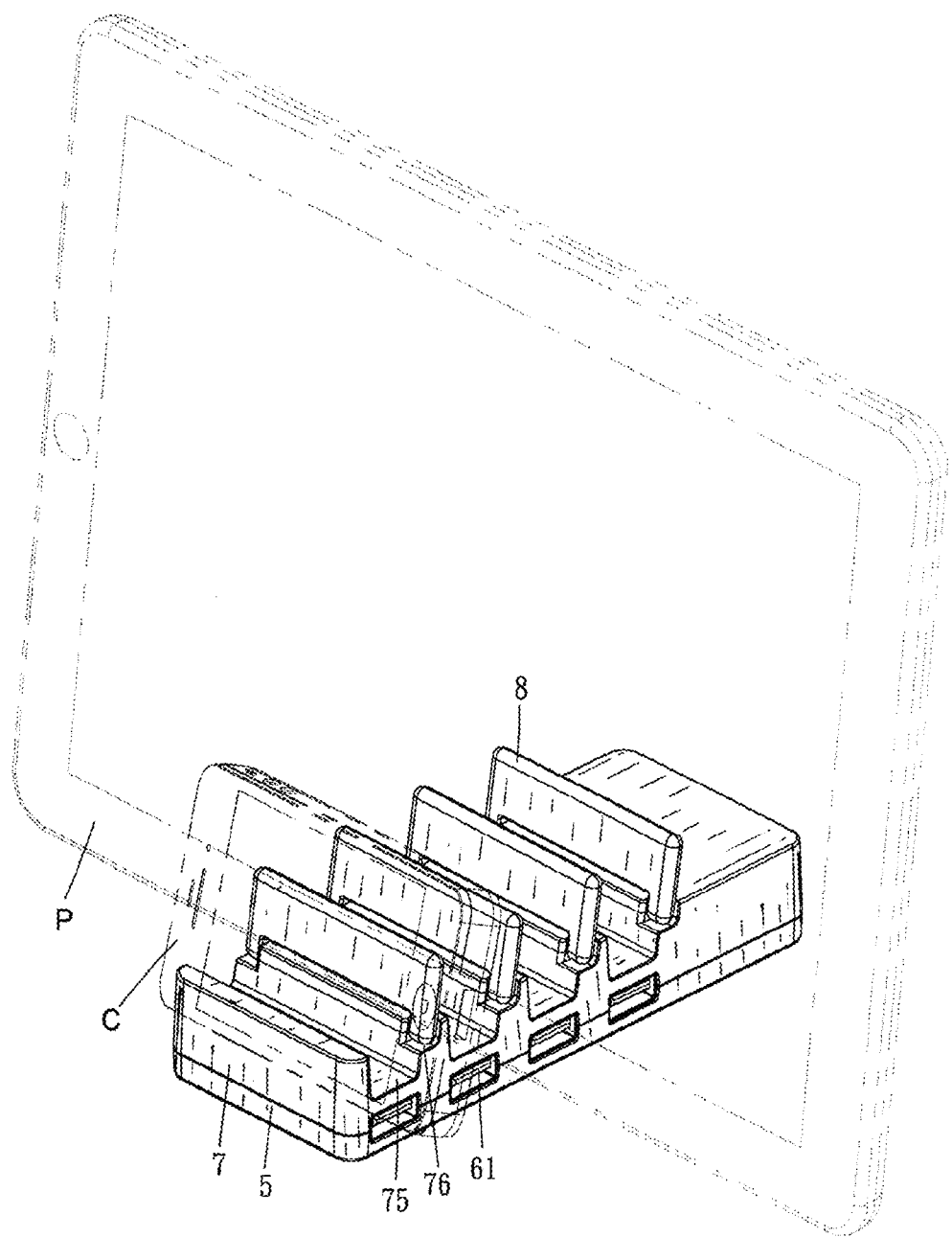
FIG. 8 is a view similar to FIG. 6 showing a mobile phone being placed in a section of the cover between two adjacent sliding members, and a tablet being placed in another section of the cover between a sliding member and a rear wall of the cover.

As shown in FIGS. 6 and 8, in a use state a user may pivot the pivotal members 8 upward until being stopped. Thereafter, the user may place a tablet P in one of the troughs 75, the tablet P being leaned on the inclined pivotal member 8, and place a mobile phone C in another trough 75, the mobile phone C also being leaned on the inclined pivotal member 8. It is noted that the weight of, a section of each of the casing 5 and the cover 7 indicated by 75A, is configured to provide additional support to the inclined mobile phone C and the inclined tablet P so that both the mobile phone C and the tablet P can be stably supported. In this position, a charging of the mobile phone C and/or the tablet P can be performed. A connection of the mobile phone C and/or the tablet P to the multi-functional USB hub is also possible. The LEDs 65 are activated to illuminate the pivotal members 8. The power-on light 62 is also lit.

While the invention has been described in terms of preferred embodiments, those skilled in the art will recognize that the invention can be practiced with modifications within the spirit and scope of the appended claims.

What is claimed is:

1. A multi-functional USB hub comprising:
   a casing including a plurality of U-shaped first openings on either side, a plurality of grooved rails on either side and alternating with the first openings, a plurality of grooves on either side, each groove being disposed inward of a corresponding one of the grooved rails, each groove having a T-shaped cross-section and communicating with the corresponding grooved rail, a second opening on a front end, a third opening on the front end, and a fourth opening on the front end;
   a cover including a plurality of inverted U-shaped openings on either side, a plurality of grooved rails on either side and alternating with the inverted U-shaped openings, and a plurality of transverse top troughs, each top trough interconnecting two opposite ones of the grooved rails and communicating therewith so that the casing and the cover are configured to fasten together;

a printed circuit board (PCB) disposed in both the casing and the cover and including a plurality of USB ports on either side, each USB port being disposed in both the first opening and its corresponding inverted U-shaped opening, a plurality of light emitting diodes (LED) on either side and alternating with the USB ports, a power-on light on a front end and disposed in the second opening, a power socket on the front end, the power socket being aligned with and joining the third opening, and a USB receptacle on the front end and disposed in the fourth opening; and a plurality of inverted U shaped sliding members, each including two vertical parts on two sides respectively, a horizontal part interconnecting the vertical parts, and two slides, each having a T-shaped cross-section and formed on an inner surface of the vertical part, and each slide being configured to slide a predetermined maximum distance in the corresponding groove of the same side;

wherein in an inoperative state, one vertical part of each sliding member is disposed in the grooved rail of the casing and its corresponding grooved rail of the cover of the same side, the horizontal part of each sliding member is disposed in the transverse trough, the other vertical part of each sliding member is disposed in the grooved rail of the casing and its corresponding grooved rail of the cover of the same side, and each slide is on a bottom of the corresponding groove of the casing of the same side; and wherein the sliding members are configured to pull upward by sliding the slides along the grooves of the casing and sliding the vertical parts along the grooved rail of the casing and its corresponding grooved rail of the cover of the same side until being stopped.

2. A multi-functional USB hub comprising:

a casing including a plurality of U-shaped openings on one side, and a U-shaped indentation on a front end;

a cover including a plurality of inverted U-shaped first openings on one side, a second opening on a front end, a third opening on the front end, a fourth opening on the front end, a plurality of transverse top troughs, a plurality of transverse risers each adjacent to the top trough, and a plurality of elongated cavities each spaced from the riser so that the casing and the cover are configured to fasten together;

a printed circuit board (PCB)s disposed in both the casing and the cover and including a plurality of USB ports on one side, each USB port being disposed in both the U-shaped opening of the casing and its corresponding inverted U-shaped opening of the cover, a plurality of light emitting diodes (LED) on one side and alternating with the USB ports, a power-on light on a front end and disposed in the second opening, a power socket on the front end, the power socket being aligned with and joining the third opening, and a USB receptacle on the front end and disposed in both the indentation of the casing and its corresponding fourth opening of the cover; and a plurality of inverted U shaped pivotal members, each including two opposite pivots on an inner surface, and a separate, elongated covering element having two wells at two sides respectively, the wells being pivotably secured to the pivots, and the covering element being placed on the cavity;

wherein in an inoperative state, the pivotal members are disposed on a top of the cover; and wherein the pivotal members are configured to pivot upward until being stopped.

* * * * *